United States Patent [19]

Upadhyay et al.

[11] Patent Number: 4,616,142

[45] Date of Patent: Oct. 7, 1986

[54] METHOD OF OPERATING PARALLEL-CONNECTED SEMICONDUCTOR SWITCH ELEMENTS

[75] Inventors: Anand K. Upadhyay, Rockford, Ill.; W. William Wold, Edina, Minn.; Pierre Thollot, Rockford, Ill.

[73] Assignee: Sundstrand Corporation, Rockford, Ill.

[21] Appl. No.: 687,803

[22] Filed: Dec. 31, 1984

[51] Int. Cl.[4] .................. H03K 17/56; H03K 3/01; G06F 1/56
[52] U.S. Cl. ................................. 307/242; 307/254; 307/296 R; 323/272
[58] Field of Search ............... 307/270, 254, 296, 242, 307/571, 252 K; 323/269, 272

[56] References Cited

U.S. PATENT DOCUMENTS 3,675,114 7/1972 Nercessian ..................... 323/269
4,532,443 7/1985 Glennon ......................... 307/270

FOREIGN PATENT DOCUMENTS 1942754 3/1971 Fed. Rep. of Germany ...... 323/269

*Primary Examiner*—Stanley D. Miller
*Assistant Examiner*—B. P. Davis
*Attorney, Agent, or Firm*—Wood, Dalton, Phillips, Mason & Rowe

[57] ABSTRACT

In power circuit designs, it is sometimes necessary to connect two or more semiconductor power switches in parallel and to simultaneously operate both so that current levels in excess of the rated current handling capability of one of the devices can be conducted. Such operation, however, encounters the problem of current sharing which results from variations in the characteristics of the parallel-connected devices. The method of the present invention obviates the difficulties encountered with current sharing by operating N parallel-connected semiconductor devices one at a time in sequential fashion so that each device conducts an average current equal to the desired average output current divided by N.

5 Claims, 8 Drawing Figures

METHOD OF OPERATING PARALLEL-CONNECTED SEMICONDUCTOR SWITCH ELEMENTS

DESCRIPTION

1. Technical Field

The present invention relates generally to power switching circuits and more particularly to a method of operating two or more parallel-connected semiconductor switches.

2. Background Art

In power circuit design, it is sometimes necessary to connect two or more semiconductor power switches in parallel and to simultaneously operate both so that current levels in excess of the rated current handling capability of one of the devices can be delivered to a load. Parallel operation of power switches is sometimes also employed when packaging constraints negate the use of a single large semiconductor device. Parallel operation, however, encounters the problem of current sharing which results from variations in the internal resistance and the turn on and turn off times of the parallel-connected devices. These variations can result from manufacturing tolerances, the difference in parasitic parameters associated with interconnection of various devices and the difference in device electrical characteristics due to operation at different junction temperatures.

Current sharing can cause less than optimal circuit operation or even destruction of one or more of the parallel-connected semiconductor devices due to the unequal sharing of current by the devices. The unequal current division can initially appear as only a small difference in current handled by each device but can grow to the point where one or more of the devices would conduct most of the current, thereby resulting in the above-noted difficulties.

In the past, such problems were minimized by the use of carefully matched semiconductor devices to insure that the steady state and transient currents were approximately equally shared. The parallel devices were triggered simultaneously with very fast rising pulses and specialized packaging techniques were used to equalize electrical and thermal impedances of the parallel set of devices.

Another solution to the above problem was to use coupling reactors or additional impedances connected to each device to offset the mismatch in device characteristics. For example, Wilkinson U.S. Pat. No. 3,699,358 discloses the use of transformers connected in the emitter circuits of a plurality of parallel-connected transistors to insure equal current division among the transistors. Another approach is disclosed in Marumoto et al U.S. Pat. No. 4,207,478 which discloses the use of impedance elements in the base drive circuits of a plurality of parallel-connected transistors to insure that the currents in the collectors of the devices are equalized when the devices are turned off.

It has been found that the above solutions to the current sharing problem have not been completely satisfactory since each requires testing of devices to insure proper matching, or the use of additional components which are bulky, noisy, costly and reduce system efficiency or specialized packaging techniques to equalize the electrical and thermal impedances of the devices.

Furthermore, the lead time and cost required to procure matched sets of devices for parallel connection are excessive. Maintenance and repair problems also arise when it is necessary to replace one of a matched set of parallel-connected devices. In such a case, standard off-the-shelf devices of similar current and voltage ratings cannot normally be used as replacements and hence a special order must be placed for a device which matches the electrical characteristics of the failed device.

DISCLOSURE OF THE INVENTION

In accordance with the present invention, a method of operating a power switch comprising N parallel-connected semiconductor power switch elements to produce an average output current $I_{AV}$ avoids the current sharing problem while at the same time each power switch element conducts an average current less than the average output current $I_{AV}$.

During those periods of time in which the power switch is to conduct current, each of the power switch elements is operated one at a time to develop a sequence of N pulses, each switch being operated to produce a pulse during a sequence. The sequence is repeated for the entire "on" time of the power switch. The switch elements conduct a peak current at a duty cycle which results in each switch element conducting an average current equal to $I_{AV}/N$.

Since each switch element is operated one at a time during each sequence, there are no periods of time during which two or more power switches are simultaneously conducting and hence the problem of current sharing is avoided. Hence, the method of the present invention does not require matching of the electrical characteristics of the parallel-connected switch elements. Moreover, since the level of current to be handled by each switch element is known in advance and remains constant over the life of the switch element, such switch can be sized to be capable of accommodating that current level without the usual derating which is necessary when semiconductor devices are operated in parallel. Also, the frequency of operation of each switch element is less than the frequency of the output power developed thereby and hence lower frequency switch elements can be used for a particular output frequency.

BEST MODE FOR CARRYING OUT THE INVENTION

Figure 1:
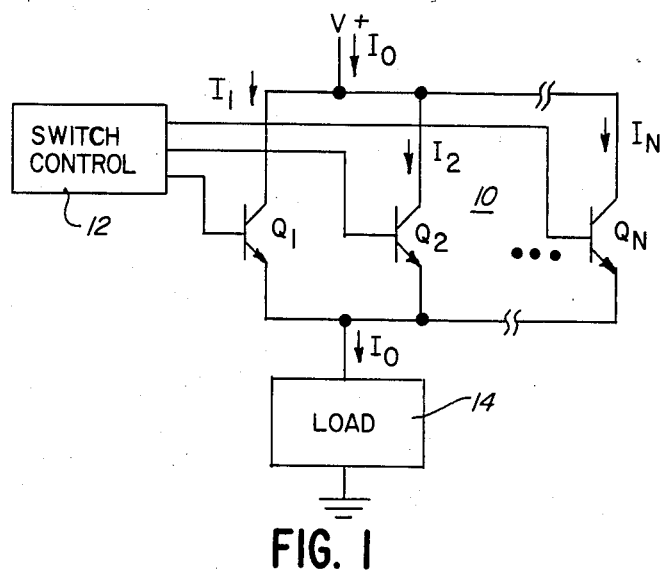
FIG. 1 is a block diagram of a switch control in conjunction with N parallel-connected switch elements.

Referring now to FIG. 1, there is illustrated a power switch 10 in the form of a plurality of N parallel-connected power switch elements $Q_1$–$Q_N$ which are operated by means of a switch control 12 to produce output current which is delivered to a load 14 from a power source V+. While the switch elements $Q_1$–$Q_N$ are illustrated as bipolar transistors, it should be noted that these switch elements may comprise thyristors, gate turn-off thyristors (or GTO's), asymmetrical thyristors, bipolar static induction transistors, field control thyristors, insulated gate transistors, MOSFETS or any other similar power semiconductor.

Figure 2:
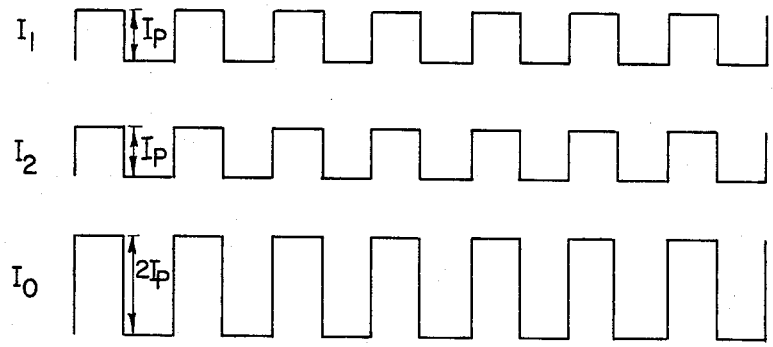
FIGS. 2 and 4 each comprise a set of waveform diagrams illustrating a prior art method of operating parallel-connected power switch elements.

Referring now to FIG. 2, there is illustrated a prior art method of operating the parallel-connected switch elements shown in FIG. 1 for the case where N=2. In this case, each switching device $Q_1$ and $Q_2$ develops switching element currents $I_1$ and $I_2$, with the two switching element currents being summed to produce the output current.

As seen in FIG. 2, the peak currents ideally handled by each switching element $Q_1$ or $Q_2$ equals a particular current $I_P$, with the total peak current equal to $2I_P$. In practice, however, the switching elements $Q_1$ and $Q_2$ are not perfectly matched and hence one switching element handles more current than the other. This phenomenon requires that the combination of switching elements $Q_1$ and $Q_2$ be derated at approximately 10–20% to account for the inevitable mismatch in device characteristics caused by the various factors described above.

The peak currents handled by the switch elements are combined to produce output current having an average value $I_{AV}$ equal to the sum of the average currents conducted by the switch elements. The element average currents are, in turn, dependent upon the peak current handled by each switch element and the ratio of "on" time to the total period of the output waveform, i.e. the duty cycle. In this case, the duty cycle of each switch element equals the duty cycle of the output waveform of the power switch.

Figure 3:
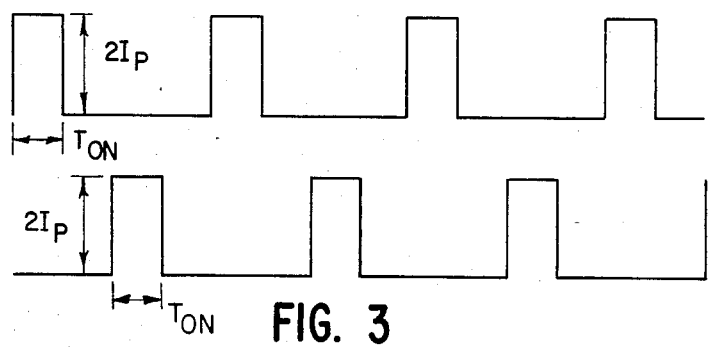
FIG. 3 is a set of waveform diagrams illustrating the method of operating two parallel-connected switch elements according to the present invention to produce an output current waveform identical to that shown in FIG. 2.

Referring now to FIG. 3, there is illustrated a method of operating N parallel-connected switch elements to produce the same output current waveform $I_0$ as that illustrated in FIG. 2. The N switches may be part of a bridge-type converter where the switches are naturally commutated by the input power to the bridge. It should be noted that while N=2 as shown in FIG. 3, N may be a greater number, if desired.

The output waveform $I_0$ is generated by operating the N switch elements one at a time with each switch element contributing one pulse out of N consecutive pulses, each pulse having an amplitude equal to $2I_P$. In other words, for the example of FIG. 3, the switch elements $Q_1$ and $Q_2$ are operated in alternate fashion, with the switch element outputs being combined to produce the desired output waveform $I_0$.

As can be seen by inspection of the waveforms of FIG. 3, each switch element operates at 1/N times the frequency of the output $I_0$, i.e. the duty cycle of each switch element is less than the duty cycle of the output $I_0$, and each element conducts an average current equal to 1/N times the average output current $I_{AV}$.

While the switch elements $Q_1$ and $Q_2$ are required to conduct peak currents greater than that which they would conduct if they were operated in a conventional manner to produce the same average current $I_{AV}$, the average current conducted by each switch element remains the same as with the prior art method of operation due to the fact that each switch element conducts for a correspondingly shorter length of time. This relationship between average current conducted by each device versus peak current renders the method of the present invention particularly suitable for use with devices with large peak to average current ratios such as thyristors, GTO's, MOSFETS followed by bipolar transistors and other such semiconductors. Of course, it is necessary to insure that each of the current rating parameters, i.e. average, peak and RMS currents for each device be maintained within rated values.

The method of the present invention results in several benefits as compared to the conventional method of operation discussed above. In the case of the conventional method, carefully matched sets of devices which are optimally packaged to minimize differences in thermal and electrical impedances are derated by approximately 10–20% to offset the inability to achieve a perfect balance between parallel paths. When utilizing the method of the present invention, however, the circuit can be designed to carry 10–20% more current without the need to specially match devices or to carefully equalize thermal and electrical impedances. In other words, significant derating is not necessary.

A second benefit results from the fact that the switching frequency of each parallel device is inherently less than the frequency of the output power developed by the combination of switching elements. In effect, the switching elements can together generate an output having a frequency F while each device need only be capable of switching at a frequency F/N, where N is the number of devices connected in parallel.

Figure 4:
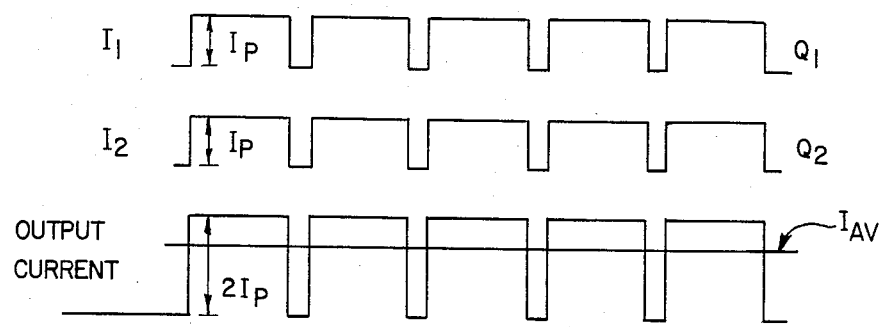

FIG. 4 illustrates a prior art method of operating N parallel-connected switches in such a supply to generate an output $I_0$ which includes a series of pulses each having an amplitude $I_{PK}$ and a duration $T_D$ to produce an average output current $I_{AV}$. As was noted in connection with FIG. 2, a pair of switch elements are operated simultaneously according to the conventional method so that each conducts peak and average currents equal to $\frac{1}{2}I_{PK}$ and $\frac{1}{2}I_{AV}$, respectively, and the duty cycle of each switch equals the duty cycle of the output $I_0$.

Figure 5:
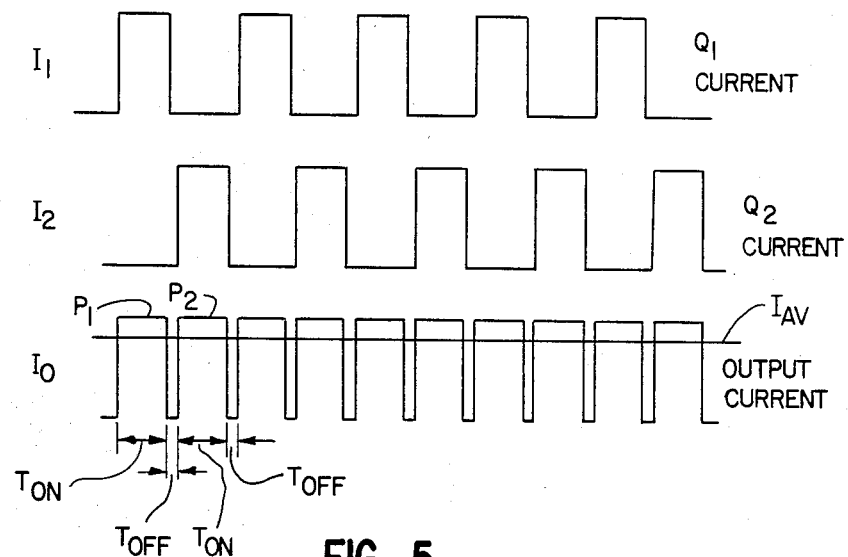
FIG. 5 is a set of waveform diagrams illustrating the method of operating two parallel-connected switch elements according to the present invention to produce an output waveform at a frequency substantially greater than the frequency of the output waveform of FIG. 4.

FIG. 5 illustrates the method of operating N parallel-connected switch elements according to the present invention to produce an output current $I_0$ having an average value equal to $I_{AV}$ at a frequency greater than the frequency of the individual switching devices. The output current waveform comprises a repetitive series or sequence of N pulses each having a pulse width $t_{on}$ and an amplitude $I_{PK}$. The pulses within each sequence are generated by operating the switch elements one at a time so that each switch element conducts a current pulse during each sequence. The duration $t_{on}$ is determined by the number of switch elements N and the desired duty cycle of the output current from the power switch.

For example, as seen in FIG. 5, a first pulse $P_1$ of the output current $I_0'$ is generated by gating the transistor $Q_1$ into conduction for a time period equal to $t_{on}$ so that the switch element $Q_1$ conducts a peak current equal to $I_{PK}$. Following the pulse $P_1$ is an off time $t_{off}$ during which time neither of the transistors $Q_1$ or $Q_2$ is on. The transistor $Q_2$ is then gated on for a time period equal to $t_{on}$ to cause conduction of a current pulse $P_2$ having a peak level equal to $I_{PK}$.

After the pulse $P_2$ is another off period $t_{off}$, following which the process repeats to derive output power having an average level $I_{AV}$ and an output frequency which is approximately twice the output frequency of the power developed using the prior art method described in connection with FIG. 2.

Assume that the waveforms shown in FIG. 4 represent the fastest practical switching rate for each transistor $Q_1$ and $Q_2$ at maximum duty cycle. When the same devices are utilized to generate the waveforms shown in FIG. 5, not only is the output power frequency doubled but also the duty ratio of each device is decreased while the net off time of the output waveform is decreased. These benefits simplify the design of input and output filters used with the switching devices. Moreover, the losses associated with each device should be approximately the same when compared with the prior art method of operation.

Figure 6:
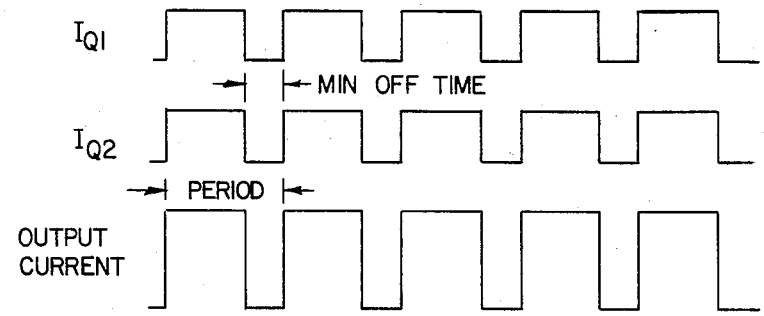
FIG. 6 comprises a set of waveform diagrams illustrating a prior art method of operating two parallel-connected switch elements wherein each switch is operated with a minimum off time.
Figure 7:
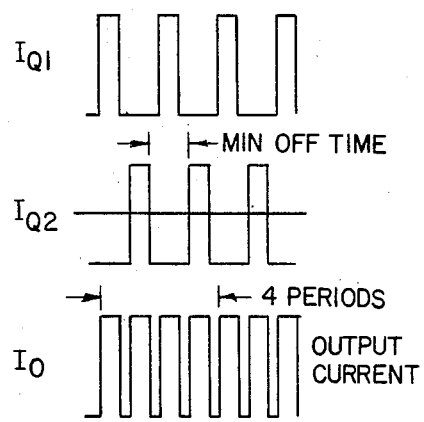
FIGS. 7 and 8 each comprises a set of waveform diagrams illustrating the method of operating two parallel-connected power switch elements according to the present invention with the same minimum off time as that illustrated in FIG. 4 for different duty cycles.

A further benefit arises in the case of parallel-connected devices requiring relatively lengthy delay or dwell times between conductive periods. One example of such a device is the GTO which requires a delay or dwell time on the order of 5 to 10 times the turn-on time. Such a limitation restricts the usefulness of the GTO in conventional high frequency switching circuit applications. As illustrated in FIG. 6, assume that the devices $Q_1$ and $Q_2$ are GTO's which, in accordance with the conventional method, are switched between on and off states with a minimum delay or off time interposed between adjacent on states. FIG. 7 illustrates the operation of the GTO's using the method of the present invention. In this case, the minimum off time is maintained for each device as are the average current handled by each device and the average output current, yet the frequency of the output power is approximately two times that produced using the conventional triggering technique. This increase in frequency allows the weight and volume of the overall power circuitry to be reduced significantly. Furthermore, the GTO's or other like device can be utilized in a relatively high frequency switching circuit.

Figure 8:
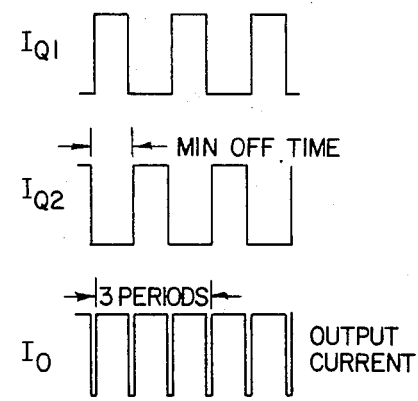

It should be noted that the duty cycle of the output power seen in FIG. 7 can be increased to a maximum value by controlling the devices $Q_1$ and $Q_2$ in accordance with the waveforms shown in FIG. 8. In such a case, the peak current handled by each device $Q_1$ and $Q_2$ is reduced as compared with the conditions shown in FIG. 7 so that the average output current $I_{AV}$ is equal for each of the waveforms illustrated in FIGS. 7 and 8.

A relationship has been found between the optimum output frequency of a circuit operated in accordance with the prior art method and the output frequency that can be obtained utilizing the method of the present invention:

$$f_2 = (T_1/t_{offmin})(N-1)f_1$$

where $f_1$ equals the optimum output frequency of the circuit utilizing the prior art method, $f_2$ is the output frequency of the circuit utilizing the method of the present invention, $T_1$ equals the period of $f_1$, $t_{offmin}$ equals the minimum permissible off time of the selected device and N equals the number of devices in parallel.

In summary, the N parallel-connected power switch elements are operated one at a time for a duration $t_{on}$ to produce an average current $I_{AV}/N$, with the currents developed by each switch element being summed to produce an output current having an average level $I_{AV}$. In effect, this means that the duty cycle of each device is substantially less than the duty cycle of the output power.

While the waveforms illustrated herein indicate that the N parallel-connected devices are operated cyclically to produce a cyclical output, it should be noted that the devices can alternatively be operated to produce a continuous output, if desired, such as in the case of a solid state contactor which is to be maintained in a closed state by means of a continuous current in a control electrode.

We claim:

1. In a method of operating a power switch coupled to a power source to produce an output having a desired average level $I_{AV}$ at a selected output duty cycle, the power switch comprising N parallel-connected semiconductor switch elements, each switch element conducting an average current equal to $I_{AV}/N$, the improvement comprising:
   operating each of the N switch elements for a length of time while maintaining the remaining switch elements in an off state to produce a series of pulses so that each switch element is operated at a duty cycle less than the selected output duty cycle of the power switch.

2. In a method of operating a power switch which has N parallel-connected semiconductor switch elements, the power switch having an average output current, the improvement comprising:
   operating each of the semiconductor switch elements to conduct one at a time to conduct an average current equal to the average output current of the switch divided by N.

3. In a method of cyclically operating a power switch which has N parallel-connected semiconductor switch elements, the power switch having an average output current with a selected duty cycle, the improvement comprising:
   for each cycle of the power switch, operating each of the semiconductor switch elements to conduct one at a time with a duty cycle less than the switch duty cycle to conduct an average current equal to the average output current of the switch divided by N.

4. A method of operating a power switch comprising N parallel-connected switch elements coupled to a power source to produce an output having a sequence of N pulses with a desired average level, the method comprising the steps of:
   (a) closing a first switch element and maintaining the remaining N-1 switch elements open to produce a first one of the N pulses;
   (b) turning off all of the switch elements;
   (c) closing a different one of the switch elements and maintaining the remaining N−1 switch elements open to produce a successive one of the N pulses; and
   (d) repeating steps (b) and (c) so that each of the N switch elements is operated once during each cycle of the output, each switch element producing an average level equal to the desired average level divided by N.

5. The method of claim 4, wherein the power switch has a selected duty cycle and wherein the steps (a) and (c) each include the step of operating each switch element at a duty cycle less than the power switch duty cycle.

* * * * *